April 1, 1969 B. H. COPELAND 3,435,520

BRAZE GROUNDED LEAD HEADER

Filed Feb. 28, 1966

INVENTOR
BEN H. COPELAND

BY John E. Vandigriff
ATTORNEY

United States Patent Office 3,435,520

Patented Apr. 1, 1969

3,435,520

BRAZE GROUNDED LEAD HEADER

Ben H. Copeland, Richardson, Tex., assignor to Texas Instruments Incorporated, Dallas, Tex., a corporation of Delaware Filed Feb. 28, 1966, Ser. No. 530,507
Int. Cl. H01n *43/00;* H05k *3/00;* H01b *13/00*
U.S. Cl. 29—628 9 Claims

ABSTRACT OF THE DISCLOSURE

Disclosed is a method of forming a grounded lead header by fusing a braze coated lead and a glass preform to a header eyelet simultaneously.

Figure 1:
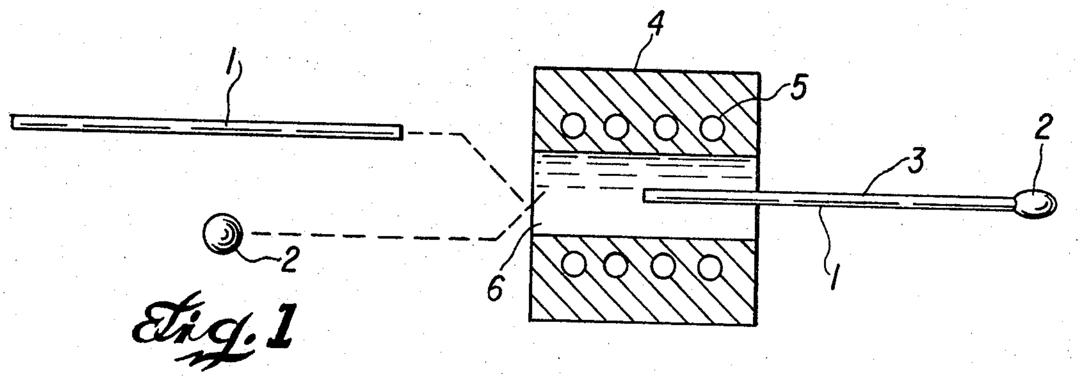

This invention relates to headers for semiconductor devices and more particularly to a method for simultaneously attaching a lead wire to the underside of a header eyelet while securing said lead wire and other lead wires in a sealing glass within the header eyelet.

In the manufacture of headers for semiconductor devices and the like, it is often desirable to have one of the leads bonded to the header while the other leads are sealed in a glass or ceramic to insulate them from the header eyelet. In this manner the header may be grounded or, if the device is mounted directly to the header, the header and the lead wire bonded thereto serve as one of the connections to the device. Since the header may serve as a heat sink for the device, a large number of transistors and other semiconductor devices are bonded directly thereto requiring that the header and an attached wire serve as one of the lead wires.

Attaching the lead wire to the header usually involves one or more steps separate from the other steps used in manufacturing the header. The lead must be bonded in some manner to the inside of the header and extended downward in a direction parallel to the other lead wires connected to a device mounted on the header. It is therefore one object of the invention to provide a method for attaching a lead wire to a semiconductor header eyelet.

It is still another object of the invention to provide a method for attaching a lead wire to the underside of a semiconductor header eyelet while simultaneously fusing glass insulation therein.

One feature of the invention is a semiconductor header having a lead wire brazed to the underside of a header eyelet utilizing an alloy material applied to one end of said lead wire.

Figure 2:
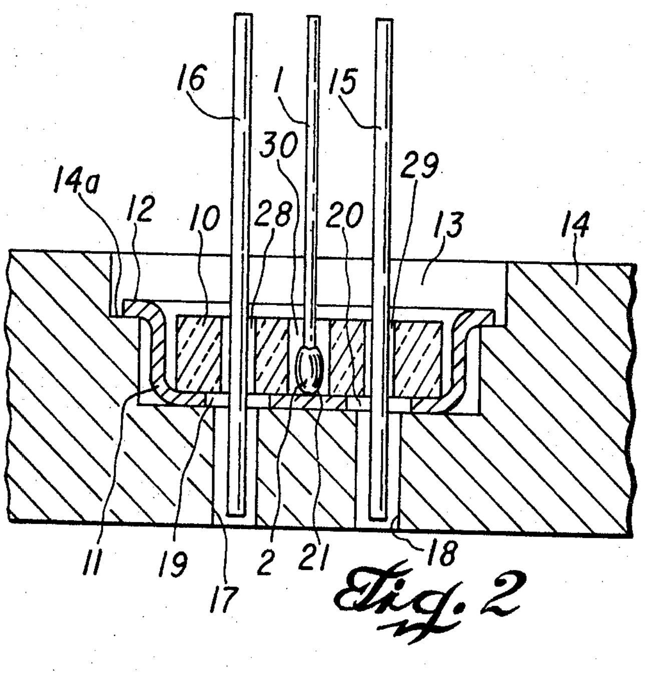
Figure 3:
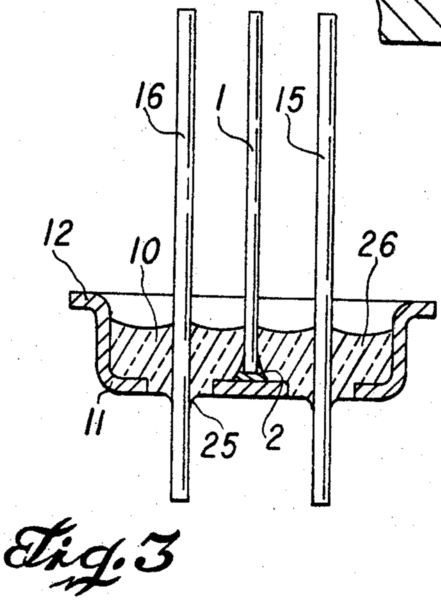

Other objects and features of the invention will become more readily understood from the following detailed description and appended claims when considered in conjunction with the accompanying drawing in which like reference numerals designate like parts throughout the figures thereof and in which:

FIGURE 1 illustrates one method of applying a braze material to the end of a lead wire by placing the lead wire and a ball of braze material in a furnace to bond the material to one end of said wire;

FIGURE 2 shows a semiconductor header eyelet having several lead wires and a preform of insulating material placed therein in a graphite carrier prior to bonding the parts together; and FIGURE 3 shows a cross-sectional view of a completed transistor header with a wire brazed to the underside of the header eyelet and two other wires held in place by an insulating material fused within the header eyelet.

Referring to the drawing, there is shown in FIGURE 1 a method for applying braze material to one end of a lead wire. Wire 1 and the ball 2 of braze material are placed in a suitable fixture (not shown) so that the ball 2 is in contact with the wire. The fixture with the wire and braze material therein is placed in opening 6 of furnace 4 which is heated by electrical coil 5. The furnace is brought up to a temperature of about 1000° C. to fuse the braze material to the wire. The wire with the braze material on one end is shown at 3. The braze material may be applied to the wire by other convenient means. For example, the braze material may be plated or electrodeposited onto one end of the wire.

The wire and the braze material may be of any suitable material, for example, the wire may be of a nickel-iron-cobalt alloy, for example, one commonly referred to by the trade name Kovar. The braze material may be of any suitable brazing alloy, for example, a silver alloy of about 90% silver and 10% copper or even pure silver. In some instances it may be desirable to nickel plate the lead wire before the material is applied to improve the bonding of the braze material to the lead wire.

FIGURE 2 shows a graphite carrier 14 having a header eyelet 11 positioned therein. The header eyelet rests in the bottom of the graphite carrier 14 with flange 12 of the eyelet resting upon ledge **14*a*. Glass preform 10 is placed within the header with holes 28 and 29 in the preform aligned with holes 19 and 20 in the eyelet. Two lead wires 16 and 15 respectively extend through the holes 28 and 29 in the glass preform 10 and openings 19 and 20 in the header eyelet so that the wires extend into openings 17 and 18 in the carrier. Lead wire 1 with braze material thereon is inserted into opening 30 in glass preform 10 and placed in an abutting relationship with the header eyelet at surface 21. With the three lead wires and the glass preform positioned within the header, it is ready to be placed into a furnace such as the one shown in FIGURE 1 to fuse the braze material of lead 1 to the header eyelet at 21** and fuse the glass to the leads and to the inside of the header eyelet. The entire assembly within the boat is placed in the furnace and heated to about 1000° C.

FIGURE 3 is a cross-sectional view of the completed header after the glass is fused. The glass is fused to the inside of the header eyelet and to the lead wires, and a small amount of the glass extends downward at 25 due to capillary action of the glass along the lead wires. Lead wire 1 is brazed to the inside of the header eyelet with the braze material 2, thereby making a good electrical contact thereto. Lead wires 15 and 16 are held in place and insulated from the header by the glass 10.

The level of the glass 10 is shown at 26. This level is established to keep the glass from extending onto the flange 12. If the glass did extend onto the flange, it probably would be broken during subsequent sealing operations on the header. Oftentimes a groove (not shown) is extended around the inner periphery of the header eyelet, above the glass, to prevent the glass from extending onto the flange. Such a groove is described in Patent No. 3,193,443, issued July 6, 1965.

In practice, the three leads and the header are gold plated. Gold plating of the braze material inhibits oxidation of the braze alloy. Headers for semiconductor devices are usually gold or even nickel plated before the devices are mounted thereon, since these metals are not reactive with various etch and cleaning solutions used in the manufacture of semiconductor devices.

The glass material may be any sealing glass; however, it is preferable that it be a glass which has a thermal coefficient of expansion similar to the coefficient expansion of the material used in the header eyelet. A glass matching the coefficient of expansion of the nickel-iron-cobalt alloys generally used is Corning No. 7052 which is borosilicate glass. However, any suitable glass may be used.

Although the present invention has been shown and illustrated in terms of a specific preferred embodiment, it will be apparent that changes and modifications are possible without departing from the spirit and scope of the invention as defined in the appended clamis.

I claim:

1. A method of construction for a grounded lead header, comprising the steps of:

(a) coating at least one end of a wire with a braze material;

(b) placing a glass preform, said braze coated wire and at least one additional wire in a header eyelet, said braze coated wire extending through said glass preform with said braze material abutting said header eyelet and said at least one additional lead extending through said glass preform and said header eyelet;

(c) heating said glass preform and said braze material to fusing temperatures to fuse said glass preform to said header eyelet, to said braze coated wire and to said at least one lead, and to fuse said braze coated wire to said header eyelet at the point of abutment, thereby providing an electrical connection thereto; and (d) solidifying said preform and braze material by cooling to render said grounded lead header.

2. The method as defined in claim 1 wherein said braze material and said glass preform are heated to about 1000° C. to fuse said glass and said braze coated wire to said header eyelet.

3. The method as defined in claim 1 wherein said braze material is a silver alloy and said wire is of an iron-nickel-cobalt alloy.

4. The method as defined in claim 1 wherein said coating is applied to said wire by plating.

5. A method of construction for a grounded lead header, comprising the steps of:

(a) coating at least one end of a lead wire with a braze material;

(b) engaging one surface of a header eyelet with said braze material on one end of said lead wire;

(c) extending at least one other lead wire through at least one opening in said header eyelet;

(d) placing an insulating material comprising substantially glass within said header eyelet;

(e) heating said braze material and said insulating material comprising substantially glass to fusing temperatures for fusing said braze material on one end of said lead wire and said insulating material to said header eyelet, said insulating material fusing to and holding said lead wire and at least one other lead wire in place and insulating said at least one other lead wire from said header eyelet; and (f) solidifying said braze material and said insulating material comprising substantially glass by cooling to render said grounded lead header.

6. The method as defined in claim 5 wherein said insulating material has the same thermal coefficient of expansion as the material of said header eyelet.

7. The method as defined in claim 5 wherein said insulating material is glass.

8. A method of construction for a grounded lead header, comprising the steps of:

(a) placing a plurality of wires in a header eyelet, one of said wires having a coating of electrically conductive material on one end thereof making contact with a surface of said eyelet and at least one of said wires extending through said eyelet;

(b) placing an insulating material comprising substantially glass in said header eyelet;

(c) heating said header eyelet to the fusing temperatures of said conductive material and said insulating material comprising substantially glass to fuse said insulating material therein to said wires and said header eyelet, and to fuse said electrically conductive material to said header eyelet to provide an electrical connection to said header eyelet; and (d) solidifying said conductive material and insulating material comprising substantially glass by cooling to render said grounded lead header.

9. The method as defined in claim 8 wherein said lead wires and said header eyelet are gold plated.

References Cited

UNITED STATES PATENTS

| | | | |
|---|---|---|---|
| 3,140,343 | 7/1964 | Wakely | 317—234 |
| 3,143,787 | 8/1964 | Babbe | 29—625 |
| 3,177,576 | 4/1965 | Kuzminski | 29—471.9 XR |
| 3,188,720 | 6/1965 | Huani | 29—471.9 XR |
| 3,276,854 | 10/1966 | Felker et al. | 29—591 XR |
| 3,307,134 | 2/1967 | Griest | 174—52.5 |

JOHN F. CAMPBELL, *Primary Examiner.*

R. W. CHURCH, *Assistant Examiner.*

U.S. Cl. X.R.

174—52; 29—471.1, 471.9, 527, 530, 624